(12) United States Patent
Anderson (10) Patent No.: US 9,485,561 B2
(45) Date of Patent: Nov. 1, 2016

(54) THERMAL POWERED WEARABLE DEVICE

(71) Applicant: Logitech Europe S.A, Lausanne (CH)

(72) Inventor: Jeffrey Anderson, Camas, WA (US)

(73) Assignee: LOGITECH EUROPE S.A., Lausanne (CH)

( * ) Notice: Subject to any disclaimer, the term of this patent is extended or adjusted under 35 U.S.C. 154(b) by 139 days.

(21) Appl. No.: 14/460,206

(22) Filed: Aug. 14, 2014

(65) Prior Publication Data
US 2016/0050479 A1   Feb. 18, 2016

(51) Int. Cl.
  *H04R 1/10* (2006.01)
  *H01L 35/32* (2006.01)
  *H04R 5/033* (2006.01)

(52) U.S. Cl.
  CPC ............. *H04R 1/1025* (2013.01); *H01L 35/32* (2013.01); *H04R 5/0335* (2013.01)

(58) Field of Classification Search
  None
  See application file for complete search history.

(56) References Cited

U.S. PATENT DOCUMENTS

| | | | |
|---|---|---|---|
| 5,419,780 A | 5/1995 | Suski | |
| 2006/0169314 A1* | 8/2006 | Horio | H01L 35/30 381/328 |
| 2009/0069045 A1* | 3/2009 | Cheng | H04B 1/385 455/556.1 |
| 2013/0109440 A1* | 5/2013 | Kroll | H04M 1/6066 455/569.1 |
| 2013/0315425 A1* | 11/2013 | Lunner | H04R 25/00 381/323 |
| 2014/0168349 A1 | 6/2014 | Eom et al. | |

OTHER PUBLICATIONS

Colin Jeffrey, "Pelty Bluetooth Speaker Powered by . . . Fire", www.gizmag.com/wireless-bluetooth-candle-powered-speaker, Jun. 30, 2014.
In Wikipedia. Retrieved Aug. 8, 2014, "Wearable Technology".

* cited by examiner

*Primary Examiner* — Muhammad N Edun
(74) *Attorney, Agent, or Firm* — Patterson & Sheridan LLP (57) ABSTRACT

Embodiments disclosed herein generally relate to electronics powered by thermal energy. More particularly, embodiments of the present disclosure relate to wireless headphones that are powered by thermoelectric generators. One embodiment provides a wireless headphone having a wireless audio device capable of generating an acoustic output from signals received through a wireless communication link, and a thermoelectric generator assembly configured to provide electrical power to the wireless audio device.

21 Claims, 7 Drawing Sheets

THERMAL POWERED WEARABLE DEVICE

BACKGROUND

Field

Embodiments disclosed herein generally relate to consumer electronic devices that include the use of a self-sustaining power source. More particularly, embodiments of the present disclosure relate to wearable devices that are powered by a thermoelectric generator.

Description of the Related Art

Wireless headphones allow users to be un-tethered to a video, gaming or music playing platform. Wireless headphones are particularly popular among video game players, since a player will not become entangled in an interconnecting cord, which connects the headphones to the gaming platform, while the player is playing the video game. However, the state-of-the-art wireless headphones are powered by batteries, such as primary or secondary (rechargeable) batteries. Primary batteries have to be replaced when consumed. Rechargeable batteries have to be plugged into a power source for a period of time to be recharged. The replacing or recharging of batteries is an inconvenience to the users, since it can be costly during periods of high use, it may require the headphones to be unusable for a significant amount of time while they are being recharged and/or lead to a significant amount of environmentally hazardous waste that needs to be recycled.

Therefore, there is a need for wireless headphones and/or other wearable devices having a self-sustaining or an unexhaustable electrical power source.

SUMMARY

Embodiments of the present disclosure relate to wireless headphones and/or other wearable devices that are powered by a self-sustaining and/or inexhaustible power source, such as a power source containing a thermoelectric generator.

One embodiment provides a wireless headphone. The wireless headphone includes a wireless audio device capable of generating an acoustic output from signals received through a wireless communication link, and a thermoelectric generator assembly configured to provide electrical power to the wireless audio device.

Another embodiment provides an audio system. The audio system includes a wireless headphone and an audio source. The wireless headphone includes a wireless audio device capable of generating an acoustic output from signals received through a wireless communication link, and a thermoelectric generator assembly configured to provide electrical power to the wireless audio device. The audio source includes a transceiver capable of establishing a wireless communication link with the wireless headphone.

Another embodiment provides a method for powering a wireless headphone. The method includes generating electricity using a thermoelectric generator assembly by contacting a first surface of the thermoelectric generator assembly to a body part of a user of the wireless headphone while exposing a second surface of the thermal electric generator assembly to an ambient environment to obtain a temperature difference between the first surface and the second surface, and providing the electricity generated by the thermoelectric generator assembly to a wireless audio device.

Another embodiment provides an electrically operated eyewear that is configured to deliver audio information and/or visual information to a user. The electrically operated eyewear includes an electric device, and a thermoelectric generator assembly configured to provide electrical power to the electric device. In one embodiment, the thermoelectric generator assembly may be attached to one or more of the temple arms of the eyewear. In another embodiment, the electric device includes a wireless communication device. The electric device may further include one or more display devices superimposed over lenses of the eyewear.

Embodiments of the disclosure may further provide a device for providing information to a user, comprising a frame having at least one lens, an electric device coupled to the frame and configured to provide audio and/or visual information to a user, and a thermoelectric generator assembly configured to provide electrical power to the electric device. The device may further include a temple arm, wherein the thermoelectric generator assembly is coupled to the temple arm. In some configurations the device may further include a display element coupled to the at least one lens, and a temple arm, wherein the thermoelectric generator assembly is disposed on or within the temple arm and the electric device is coupled to the display element.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

In the following description, numerous specific details are set forth to provide a more thorough understanding of the present disclosure. However, it will be apparent to one of skill in the art that the present disclosure may be practiced without one or more of these specific details. In other instances, well-known features have not been described in order to avoid obscuring the present disclosure.

Embodiments of the present disclosure relate to wearable devices, such as wireless headphones and/or electronic glasses, that are powered by a self-sustaining and/or inexhaustible power source, such as a power source containing a thermoelectric generator. In one embodiment of the disclosure, a thermoelectric generator is used to harvest thermal energy from heat generated by the body of a user to generate electricity that wireless headphones, electronic glasses and/or other similar devices use to deliver audio information and/or visual information to the user.

The thermoelectric generator powered wearable devices according to embodiments of the present disclosure are advantageous over other solutions that also harvest energy from the ambient environment, such as solar cell powered headphones. For example, thermoelectric generator powered headphones may be used in dark home environment, such dark home-theater rooms, on an airplane, or other similar environment where the solar cell powered headphones are unable to generate electricity.

According to the present disclosure, a wireless headphone may include an array of thermoelectric generating parts mounted in a headband and/or ear covers (e.g., earspeakers, earphones or earbuds). When one surface of the thermoelectric generating parts is thermally connected to the user's body, for example, the user's head, and transversely an opposite surface of the thermoelectric generating parts is exposed to the ambient environment, the thermoelectric generating parts generate current due to the temperature differential created between the surface contacting the body and the surface exposed to the ambient environment. Since the head is one of the warmest parts of the human body and a significant amount of heat is lost in this region of the body, the headphones of the present disclosure most efficiently use the user's head as a heat source to generate electric power that the electronics in the headphones can use to deliver audio content to the user. However, the thermoelectric generating parts may also be in thermal contact with other portions of the user's body, such as the user's arm (e.g., forearm, wrist, finger, bicep, etc.), leg, foot, ankle, neck, body cavities or other useful portions of the user's body.

Figure 1A:
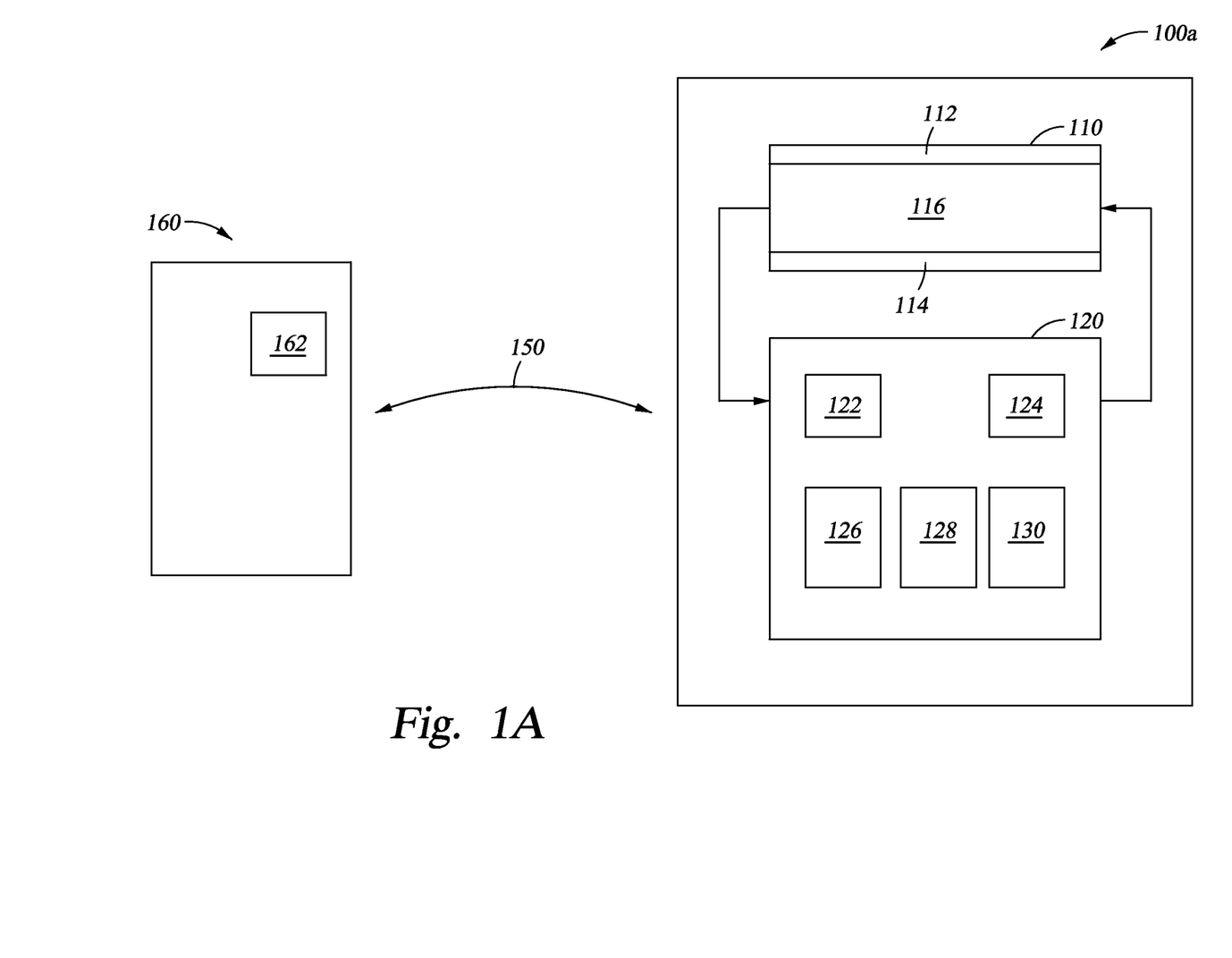
FIGS. 1A-1C are conceptual diagrams that illustrate a wireless headphone according to embodiments of the present disclosure.

FIG. 1A is a conceptual diagram that illustrates a wireless headphone 100a according to one embodiment of the present disclosure. The wireless headphone 100a includes a thermoelectric generator assembly 110 and a wireless audio device 120. The thermoelectric generator assembly 110 generates electric power from a temperature difference created between two opposing surfaces. The thermoelectric generator assembly 110 is coupled to the wireless audio device 120 to provide electrical power, by generating a voltage and/or a current that is used to power the wireless audio device 120.

The wireless headphone 100a may be used to receive audio signals from an audio source 160 through a wireless communication link and render an acoustic output (e.g., audio information) to the user without requesting the user to be physically connected to the audio source 160. The audio source 160 may be any electronic device capable of transmitting an audio signal by wireless communication. The audio source 160 may be a video game console, a personal computer, a tablet computer, a laptop computer, a digital music player, a cell phone (e.g., a smart phone), an stereo system, a television, a video player (e.g., a DVD player, a Blu-ray player), a radio, or other similar device. The audio source 160 may include one or more transceivers 162 configured to establish one or more different types of wireless communication links with other transceivers. A given transceiver 162 could establish, for example, a Wi-Fi communication link, a BLUETOOTH® communication link, Avnera Audio Link (AAL) or near field communication (NFC) link, among other types of communication links.

The wireless audio device 120 may be any technical feasible computing device capable of generating an acoustic output according to input signals obtained through a wireless communication link. The wireless audio device 120 may include one or more transceivers 122 configured to establish one or more different types of wireless communication links with other transceivers, for example a wireless communication link 150 with the one or more transceivers 162 from the audio source 160. The wireless communication link 150 may be one of a Wi-Fi communication link, a BLUETOOTH® communication link, Avnera Audio Link (AAL) or near field communication (NFC) link, among other types of communication links. The wireless audio device 120 also includes one or more speakers 124 configured to generate an acoustic output.

The wireless audio device 120 may further include a processing unit 126 coupled to the one or more transceivers 122 and the one or more speakers 124. The processing unit 126 may be any hardware unit or combination of hardware units capable of executing software applications and processing data. For example, the processing unit 126 may be a central processing unit (CPU), a digital signal processor (DSP), an application-specific integrated circuit (ASIC), a combination of such units, and so forth. The processing unit 126 performs various functionalities associated with the wireless audio device 120.

The wireless audio device 120 may include a memory unit 128 that is coupled to the processing unit 126. The memory unit 128 may include any technically feasible type of hardware unit configured to store data, such as a hard disk, a RAM module, a flash memory unit, or a combination of hardware units for storing data.

The wireless audio device 120 may further include software application 130 within the memory unit 128. The software application 130 may include program codes that may be executed by the processing unit 126 to perform various functionalities associated with the wireless headphone 100a.

The thermoelectric generator assembly 110 is configured to generate electricity by converting a temperature difference created between a part of the user and the ambient environment directly into electrical energy. The thermoelectric generating assembly 110 may include any technically feasible thermoelectric generator that is capable of generating voltage and/or current to provide electric power to the wireless audio device 120. In one example, the thermoelectric generating assembly 110 is sized to generate between about 60 and about 100 milliwatts (mWatts) of power to drive the components within the wireless audio device 120.

The thermoelectric generator assembly 110 may generate electrical energy in the form of DC voltage and DC current responsive to a temperature differential created across two opposing surfaces of one or more thermoelectric generating parts 116. The thermoelectric generator assembly 110 may have two surfaces 112 and 114 disposed on opposing sides of one or more thermoelectric generating parts 116. The two surfaces 112, 114 may be surfaces that include thermal conductive materials that are formed on opposite sides of the thermoelectric generating parts 116. In one embodiment, the two surfaces 112, 114 may be formed from materials that have a higher thermal conductivity than the thermoelectric generating parts 116.

The thermoelectric generator assembly 110 may include an array of thermoelectric generating parts 116. The array of thermoelectric generating parts 116 may be connected together in series and/or in parallel to obtain the voltage and/or the current needed to power the wireless audio device 120. Each of the thermoelectric generating parts 116 may include a Peltier device that operates in a "Seebeck mode." Traditionally, Peltier devices have been used as a thermoelectric cooler that creates a temperature differential between two opposing surfaces when a voltage is applied across the thermoelectric generating parts 116. However, it has been found that a Peltier device can be operated in a "Seebeck mode" to generate electricity. That is, when a temperature differential is applied across the two opposing surfaces of a thermoelectric generating part 116, the thermoelectric generating part 116 generates a DC voltage responsive to the temperature differential. However, the thermoelectric generating parts 116 may include any technically feasible material or device structure that is capable of converting a formed temperature gradient to electrical energy. For example, the thermoelectric generating parts 116 may include one or more metal alloy containing thermoelectric material, semiconductor containing thermoelectric materials, nano-thermoelectric materials, a combination thereof, and so forth. For example, the thermoelectric generating parts 116 may include, but not limited to, one or more of bismuth chalcogenides (such as $Bi_2Te$, $Bi_2Se_3$), lead telluride, inorganic clathrates, magnesium group IV compounds (such as $Mg_2Si$, MgGe, MgSn), high silicides, skutterudite, homologous oxide compounds (such as $(SrTiO_3)_nSrO_m$), half Heusler alloys, electrically conducting organic materials, silicon germanium alloy, sodium-cobaltate, nanomaterials (such as nanostructured $Bi_2Te_3/Bi_2Se_3$, PbTe or PbSeTe), a combination thereof, and so forth. It should be noted that the thermoelectric generating part 116 according to embodiment of the present disclosure encompasses any suitable technology that coverts a temperature differential between two surfaces into an electric current flow.

The wireless audio device 120 and the thermoelectric generating assembly 110 may be assembled within one frame in the form of a headphone, in-ear headphones, a helmet having headphones, or other portable audio devices that function wirelessly. The thermoelectric generating assembly 110 may be positioned to have the surface 112 be in contact with the body of the user, such as the head, and the surface 114 exposed to the ambient environment, thus establishing a temperature difference between the two surfaces 112, 114 to enable the generation of electrical power.

When the wireless headphone 100a is used by a user, the surface 112 may be in direct or indirect contact with a body of the user, for example the head of the user, while the surface 114 is exposed to the ambient environment surrounding the user. Since temperature of human body is usually higher than the temperature of ambient environment, the surface 112 can obtain a higher temperature than the surface 114, thus establishing a temperature differential across the thermoelectric generating parts 116 to enable generation of electrical energy. For example, a temperature difference between about 20° F. to about 30° F. may be obtained between the surfaces 112 and 114 since the wireless headphone 100a is likely to be worn by a user that has a typical body and/or skin temperature of about 98° F. in an ambient environment that has a temperature of typically about 70° F.

Since the above condition is available most of the time, the thermoelectric generator assembly 110 may act as a sustainable power source for the wireless headphone 100a. The wireless headphone 100a does not need to include replaceable or rechargeable batteries, therefore the wireless headphone 100a is more convenient to use than conventional wireless headphone designs.

Figure 1B:
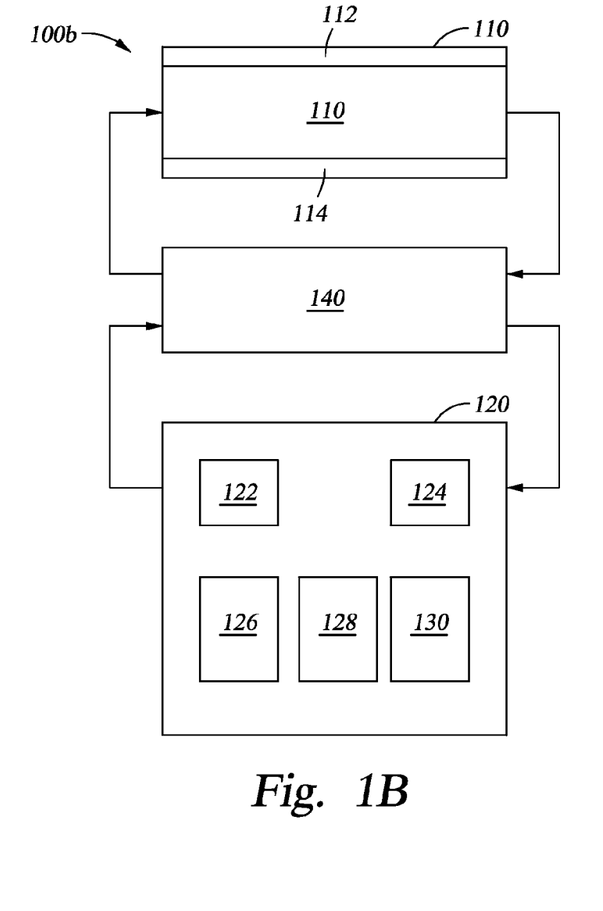

FIG. 1B is a conceptual diagram that illustrates a wireless headphone 100b according to another embodiment of the present disclosure. The wireless headphone 100b is similar to the wireless headphone 100a except that the wireless headphone 100b includes a storage unit 140. The storage unit 140 is coupled between the thermoelectric generator assembly 110 and the wireless audio device 120. The storage unit 140 is connected to store electrical energy generated by the thermoelectric generator assembly 110 and to provide electric power to the wireless audio device 120. The storage unit 140 accommodates spikes in the output of the thermoelectric generator assembly 110 by storing extra electrical energy at times of peak power generation by the thermoelectric generator assembly 110 and releasing the stored energy when the output of the thermoelectric generator assembly 110 is below the power level required by the wireless audio device 120.

The storage unit 140 may be any technically feasible electrical energy storage device. In one embodiment, the storage unit 140 may be a rechargeable battery, super capacitor or other similar energy storage device. In one embodiment, the storage unit 140 may include a recharge interface to allow the storage unit 140 to be recharged by other means, such as being plugged into a power source when the thermoelectric generator assembly 110 cannot generate enough electrical energy to satisfy the needs of the wireless audio device 120. In some configurations, the thermoelectric generator assembly 110 is used to continually supplement the amount of power stored in the storage unit 140, and thus increase the usable amount of power over time that can be drawn from an initially charged storage unit 140 by the electrical components found in the wireless headphone 100b.

Figure 1C:
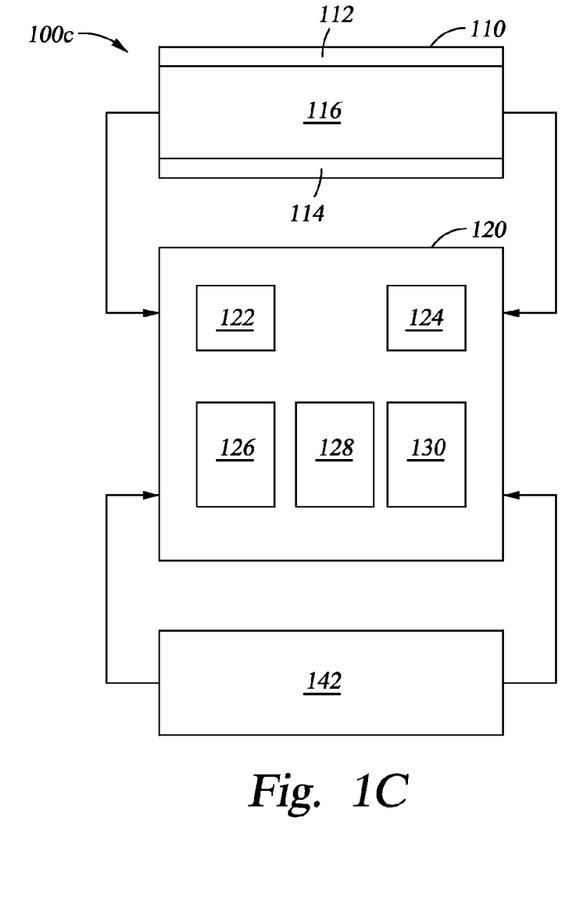

FIG. 1C is a conceptual diagram that illustrates a wireless headphone 100c according to one embodiment of the present disclosure. The wireless headphone 100c is similar to the wireless headphone 100a except that the wireless headphone 100b includes a secondary power unit 142. The secondary power unit 142 may be coupled to the wireless audio device 120. The secondary power unit 142 may function as an auxiliary or an alternative power source to the thermoelectric generator assembly 110. The secondary power unit 142 may be any technically feasible electrical energy source. In one embodiment, the secondary power unit 142 may be one or more batteries, such as primary batteries or rechargeable batteries. In another embodiment, the secondary power unit 142 may be a power generating device. In one configuration, the secondary power unit 142 generates electrical power when the thermoelectric generator assembly 110 is not able to effectively generate power, for example when it is difficult to obtain a temperature difference. In one embodiment, the secondary power unit 142 may be a solar cell configured to convert electromagnetic energy into electrical energy.

Figures 2A, 2B:
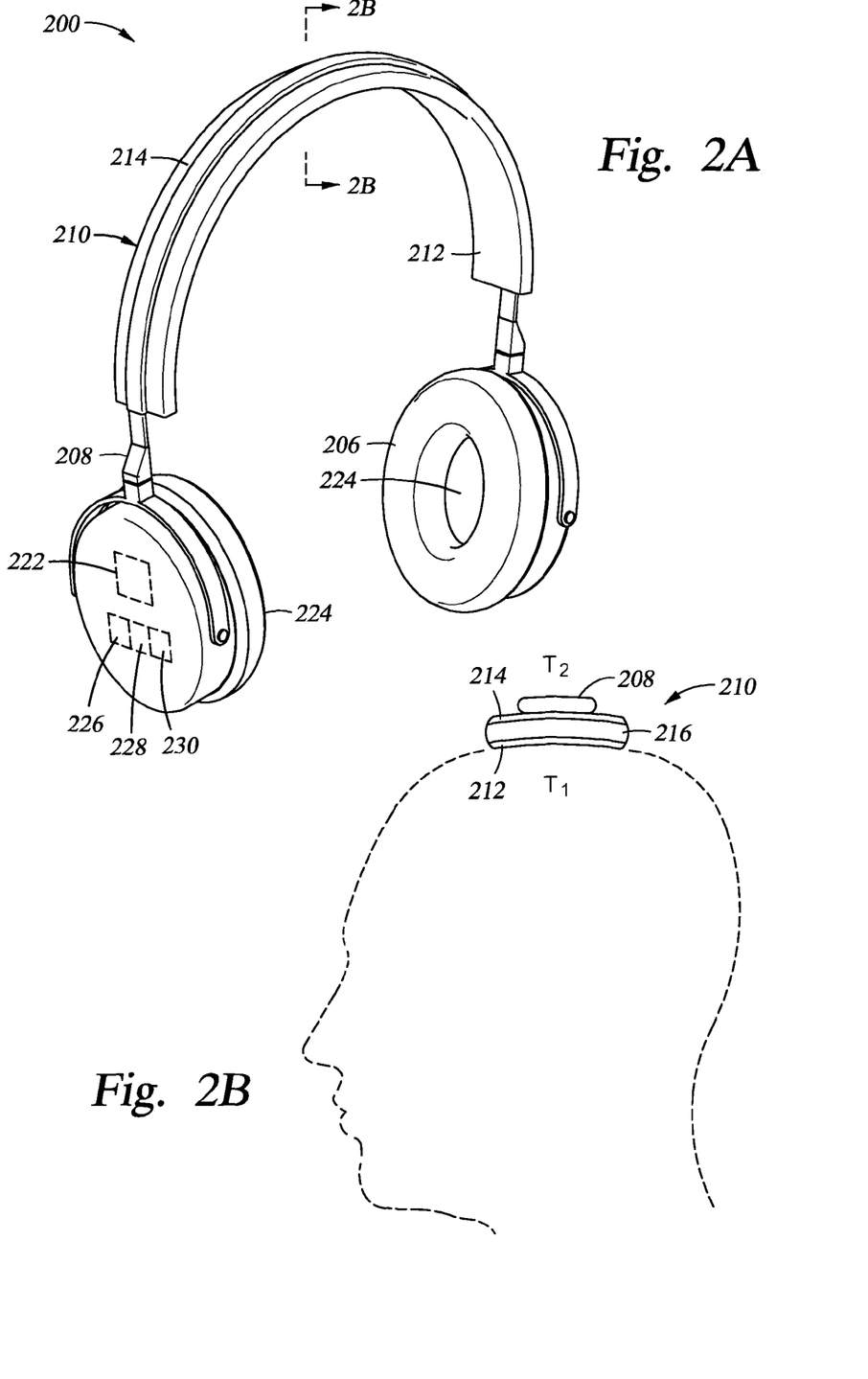
FIG. 2A is a schematic perspective view of a wireless headphone according to one embodiment of the present disclosure.
FIG. 2B is a partial sectional view of the wireless headphone of FIG. 2A showing a thermoelectric generator assembly.

FIGS. 2A-2B schematically illustrate a wireless headphone 200 according to one embodiment of the present disclosure. The wireless headphone 200 may include a frame 208 connecting two ear covers 206. A speaker 224 may be positioned inside each ear cover 206. The wireless headphone 200 may include a transceiver 222 configured to establish a wireless communication link with an audio source, such as the audio source 160 described in FIG. 1A. The transceiver 222 may be similar to the transceiver 122 described in FIG. 1A.

The wireless headphone 200 may include a processing unit 226, a memory unit 228 and a software application 230 to perform various functionalities of the wireless headphone 200. The processing unit 226 may be similar to the processing unit 126 described in FIG. 1A. The memory unit 228 may be similar to the memory unit 128 described in FIG. 1A. The software application 230 may be similar to the software application 130 of FIG. 1A. While FIG. 2A illustrates the transceiver 222, the processing unit 226 and the memory unit 228 being disposed in the ear cover 206, the transceiver 222, the processing unit 226 and the memory unit 228 may be positioned in any suitable locations in the wireless headphone 200.

The wireless headphone 200 further includes a thermoelectric generator assembly 210 configured to generate electric power from a temperature difference created between a part of a user and the ambient environment and to provide the generated electric power to the transceiver 222, the speakers 224, the processing unit 226, and/or the memory unit 228. The thermoelectric generator assembly 210 may be similar to the thermoelectric generator assembly 110 of FIG. 1A. The thermoelectric generator assembly 210 may be attached to the frame 208. In one embodiment, the thermoelectric generator assembly 210 may form a headband attached to the frame 208. When the wireless headphone 200 is in use, a first surface 212 of the thermoelectric generator assembly 210 is in contact with the user's head. A second surface 214 of the thermoelectric generator assembly 210 faces towards the ambient environment and away from the user's head, as shown in FIG. 2B. One or more thermoelectric generating parts 216 may be disposed between the first surface 212 and the second surface 214 to convert a temperature difference between the first surface 212 and the second surface 214 to electrical energy. The thermoelectric generating parts 216 may be formed from a thermoelectric material as described above. The first surface 212 and the second surface 214 may be external surfaces of thermal conductive materials attached to the thermoelectric generating parts 216. In one example, the thermally conductive material is a metal or a metal containing material that is corrosion resistant. The material of the first surface 212 and the second surface 214 may have higher thermal conductivity than the thermoelectric generating parts 216.

In one embodiment, the wireless headphone 200 may be completely powered by the thermoelectric generator assembly 210. Alternatively, a secondary power source, similar to the power source 142 of FIG. 1C, may be used to along with the thermoelectric generation assembly 210. In another embodiment, a storage unit, similar to the storage unit 140 of FIG. 1B, may be coupled to the thermoelectric generator assembly 210 to accommodate the spikes of the thermoelectric generator assembly 210.

Figure 3:
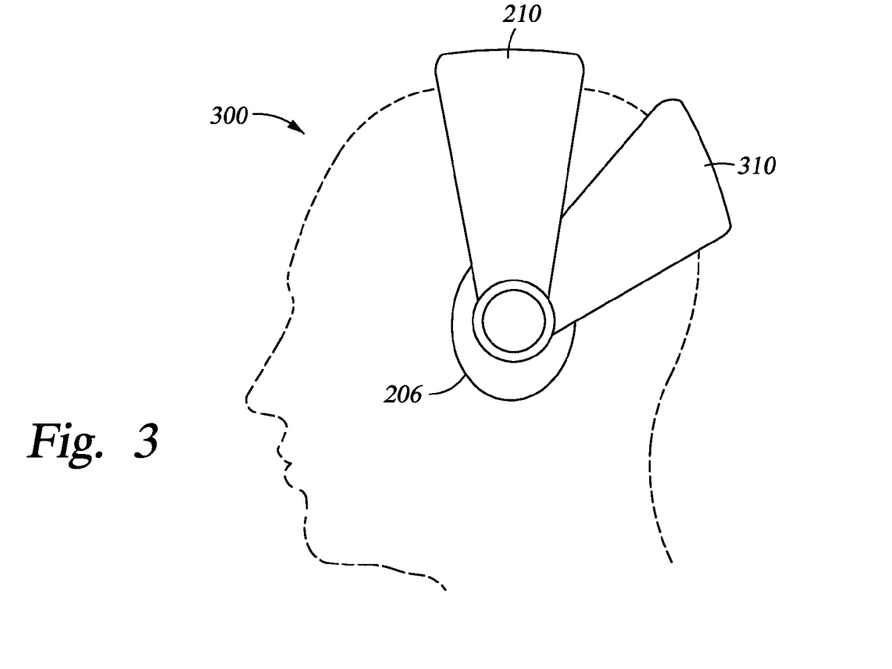
FIG. 3 is a schematic perspective view of a wireless headphone according to one embodiment of the present disclosure.

FIG. 3 is a schematic perspective view of a wireless headphone 300 according to one embodiment of the present disclosure. The wireless headphone 300 is similar to the wireless headphone 200 except that the wireless headphone 300 includes a second headband 310 that is parallel to the headband of the thermoelectric generator assembly 210. In one embodiment, the second headband 310 may include a thermoelectric generator assembly similar to the thermoelectric generator assembly 210. The second headband 310 provides additional contact area with a heat source, i.e. the user's head, to generate additional electricity. In another embodiment, the second headband 310 may be used to house an alternative power source, such as a solar cell.

Figure 4:
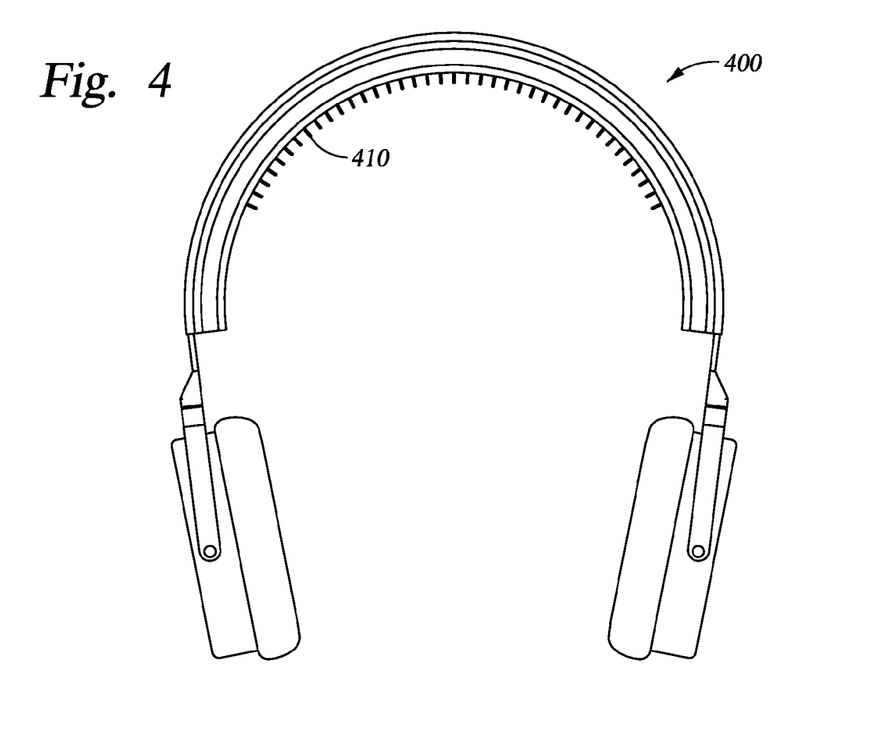
FIG. 4 is a schematic view of a wireless headphone having a heat harvesting device according to one embodiment of the present disclosure.

FIG. 4 is a schematic view of a wireless headphone 400 according to one embodiment of the present disclosure. The wireless headphone 400 is similar to the wireless headphone 200 except that the wireless headphone 400 includes a heat harvesting structure 410. The heat harvesting structure 410 may be attached to the surface 212 of the thermoelectric generator assembly 210. The heat harvesting structure 410 is configured to provide thermal exchange between the thermoelectric generator assembly 210 and the heat source, i.e. the user's head. In one embodiment, the heat harvesting structure 410 may include an array of conductive teeth extending from the surface 212. The array of conductive teeth are used to ensure good thermal contact is created between the surface of the user's head and the thermoelectric generator assembly 210. The heat harvesting structure 410 is thus configured to improve the heat harvesting structure's ability to collect the heat generated by the user. The heat harvesting structure 410 may be especially effective when direct contact with a surface of the user is difficult to establish, for example, when the user has a thick head of hair.

Figure 5:
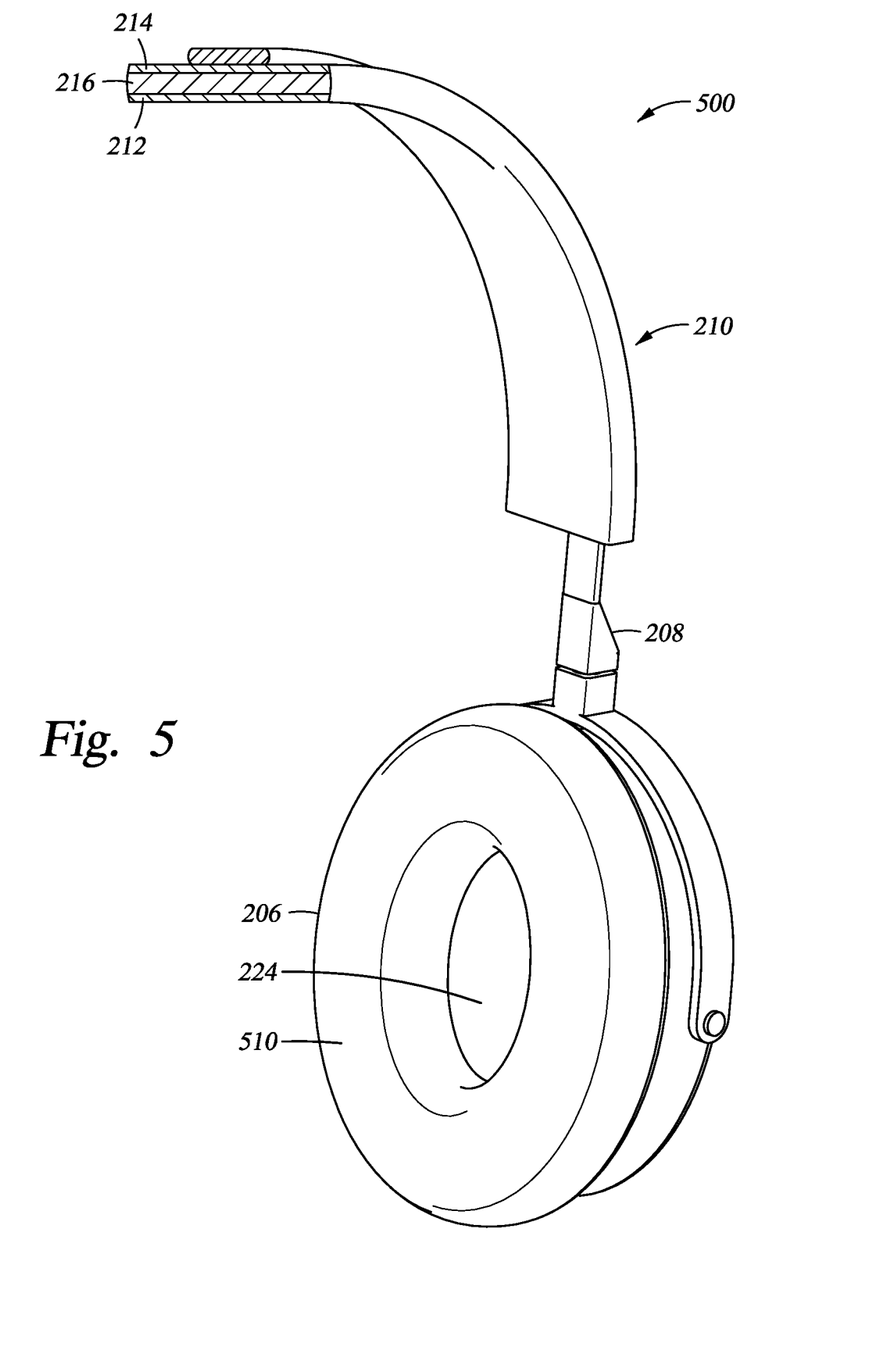
FIG. 5 is a schematic sectional view of a wireless headphone according to another embodiment of the present disclosure.

FIG. 5 is a schematic sectional view of a wireless headphone 500 according to another embodiment of the present disclosure. The wireless headphone 500 is similar to the wireless headphone 200 except that the wireless headphone 500 includes thermoelectric generator assemblies 510 on the ear cover 206. The thermoelectric generator assemblies 510 are disposed at areas of the ear covers 206 that contact the user's ears when in use. The thermoelectric generator assemblies 510 may be used alone or in combination with the thermoelectric generator assembly 210.

Figure 6:
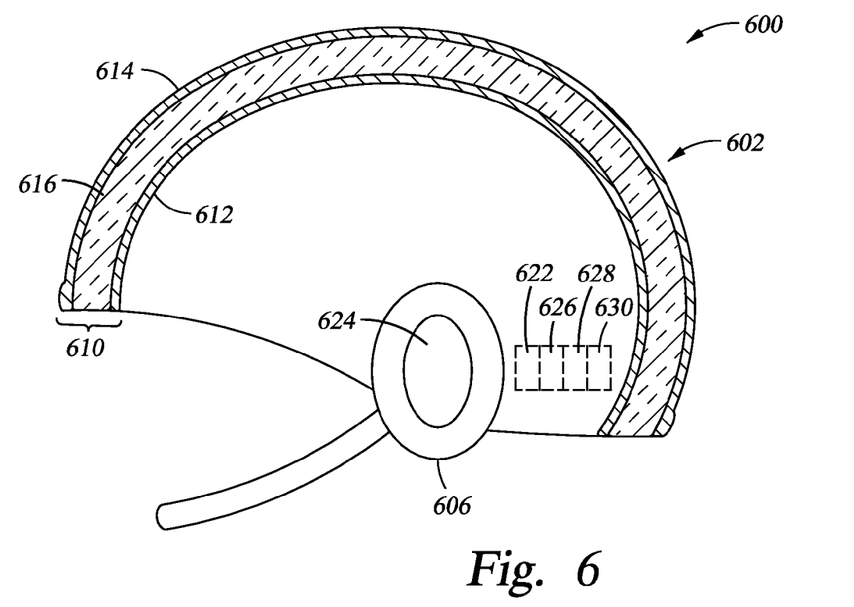
FIG. 6 is a schematic sectional view of a helmet with headphones according to one embodiment of the present disclosure.

FIG. 6 is a schematic cross-sectional view of a helmet 600 that includes a wireless audio device according to one embodiment of the present disclosure. The helmet 600 includes a head cover 602, ear covers 606, and speakers 624 disposed inside the ear covers 606. The speakers 624 may be used to generate an acoustic output from a wireless audio device. The term "helmet" as used herein is intended to broadly cover a head covering formed from a hard and/or padded material, such as leather, metal, or plastic, that is worn by soldiers, police officers, athletes (e.g., football players), firefighters, construction workers, motorcyclists, and others to protect their head.

The helmet 600 may include a transceiver 622 configured to establish a wireless communication link with an audio source, such as the audio source 160 described in FIG. 1A. The transceiver 622 may be similar to the transceiver 122 described in FIG. 1A. The helmet 600 includes a processing unit 626, a memory unit 628 and a software application 630 to perform various functionalities of the wireless headphone 600. The processing unit 626 may be similar to the processing unit 126 described in FIG. 1A. The memory unit 628 may be similar to the memory unit 128 described in FIG. 1A. The software application 630 may be similar to the software application 130 of FIG. 1A. The transceiver 622, the processing unit 626 and the memory unit 628 may be positioned in any suitable location in the helmet 600.

The helmet 600 includes a thermoelectric generator assembly 610 formed in at least a portion of the head cover 602. The thermoelectric generator assembly 610 may have a first surface 612 inside the head cover 602 to be in contact with the user's head, and a second surface 614 on the outside of the head cover 602 exposed to the ambient environment. One or more thermoelectric generating parts 616 is disposed between the first surface 612 and the second surface 614 so that the thermoelectric generating parts 616 can be used to convert a temperature difference between the first surface 612 and the second surface 614 into electrical energy. The thermoelectric generating parts 616 may be formed from a thermoelectric material as described above with the thermoelectric generating parts 116. The first surface 612 and the second surface 614 may be the external surfaces of the thermal conductive materials that are thermally coupled to the thermoelectric generation parts 616. The material disposed at the first surface 612 and the second surface 614 may have a higher thermal conductivity than the thermoelectric generating parts 616.

The thermoelectric generator assembly 610 may be electrically connected to the speakers 624, the transceiver 622, the processing unit 626, and the memory unit 628 to provide the electric energy that is needed for operation. The head cover 602 of the helmet 600 provides a large surface area for the thermoelectric generator assembly 610 to contact the user's head and collect the heat generated from the user's body. The thermoelectric generator assembly 610 can thus be used to generate a large amount of electrical power. Furthermore, the nature of the head cover 602 traps heat inside therefore enabling an increased temperature difference between the first surface 612 and the second surface 612. The thermoelectric generator assembly 610 in turn cools off the user's head by drawing the heat away from the surface 612 to the surface 614.

The helmet 600 may be used as a wireless headphone with an audio source, such as the audio source 160. The helmet 600 may also be used in other activities where acoustic output is desired in a helmet, such as a helmet for a motorcyclist, or a football helmet worn by a football player to allow the communication with other players or their coaches.

Figure 7:
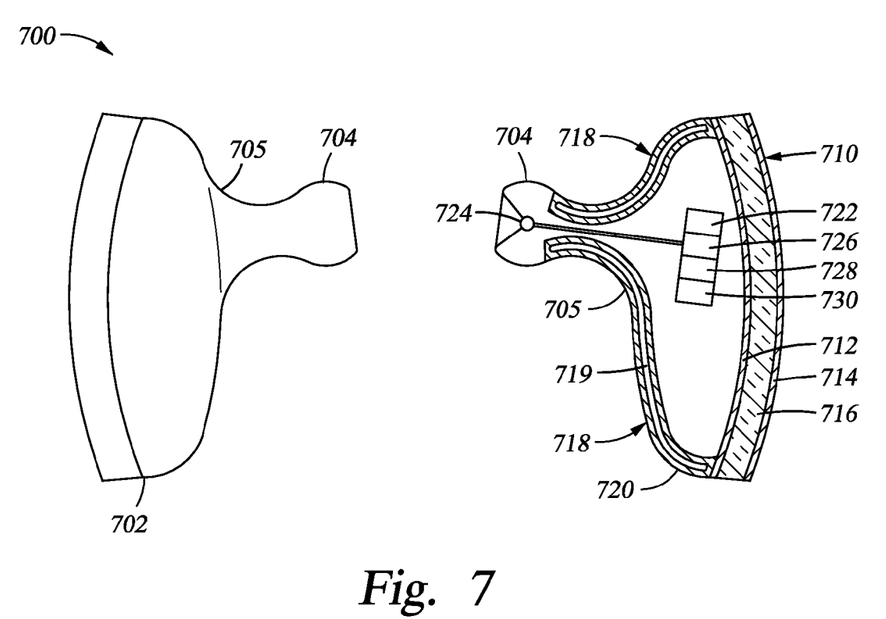
FIG. 7 schematically illustrates wireless in-ear headphones according to one embodiment of the present disclosure.

FIG. 7 schematically illustrates wireless in-ear headphones 700 according to one embodiment of the present disclosure. The wireless in-ear headphones 700 includes two ear plugs 702 that each have an in-ear end 704 to be inserted inside the user's ear canal when in use. A speaker 724 is disposed within each ear plug 702. The speakers 724 may be used to generate an acoustic output generated from a signal received from a wireless audio device.

The in-ear headphones 700 further include a transceiver 722 configured to establish a wireless communication link with an audio source, such as the audio source 160 described in FIG. 1A. The transceiver 722 may be similar to the transceiver 122 described in FIG. 1A. The wireless in-ear headphones 700 may include a processing unit 726, a memory unit 728 and a software application 730 to perform various functionalities of the in-ear headphone 700. The processing unit 726 may be similar to the processing unit 126 described in FIG. 1A. The memory unit 728 may be similar to the memory unit 128 described in FIG. 1A. The software application 730 may be similar to the software application 130 of FIG. 1A. The transceiver 722, the processing unit 726 and the memory unit 728 may be positioned in any suitable locations in the wireless in-ear headphones 700.

The wireless in-ear headphones 700 further include thermoelectric generator assemblies 710 to generate and provide electricity to the transceivers 722, the processing unit 726, and/or the memory unit 728. The thermoelectric generator assemblies 710 may include a contact surface 705 that is positioned on the ear plug 702 so as to contact a portion of the user's ear, and a second surface 714 that is on the outside of the ear plug 702 and is exposed to the ambient environment. One or more thermoelectric generating parts 716 are disposed between a first surface 712 and the second surface 714 to convert the heat generated by the user's body and received at the first surface 712 into electrical energy. In one configuration, as shown in FIG. 7, heat received by the contact surface 705 is delivered to the first surface 712 via conduction through a conducting element (e.g., casing 720), so that a temperature difference can be created between the first surface 712 and the second surface 714.

In one embodiment, the ear plug 702 may further include one or more heat harvesting structures 718 that are thermally connected to the first surface 712 and extend into the in-ear end 704 to form a good thermal contact with the user's body when in use. The one or more heat harvesting structures 718 allow the first surface 712 to receive body heat from the user and thus establishing a temperature difference with the second surface 714.

In one embodiment, the one or more heat harvesting structures 718 may include one or more heat pipes. A heat pipe generally includes a casing 720 enclosing a cavity 719. The casing 720 may be formed from a material that has a high thermal conductivity, such as cooper or aluminum. The cavity is typically filled with a fraction of a percent by volume of a working fluid, such as water, ethanol, acetone, sodium, or mercury, other suitable fluid selected according to the operating temperature of the heat pipe. Generally, the cavity is partially filled with a portion of the working fluid that is in a liquid phase and the remaining portion of the cavity is filled with a portion of the working fluid that is in a gas phase. A heat pipe generally has a hot interface at one end and a cold interface at an opposite end. Heat pipes are typically used as a heat exchange device that combines the principle of both thermal conductivity and phase transition to efficiently manage the transfer of heat between the hot interface and the cold interface. At the hot interface of a heat pipe, the liquid portion of the working fluid that is in contact with a thermally conductive casing turns into a vapor by absorbing heat from a heat source that is in thermal contact with the hot interface. The generated vapor then condenses back into liquid at the cold interface, releasing the generated latent heat to a heat sink that is in thermal contact with the cold interface. The liquid then returns to the hot interface through either capillary action or gravity and thus is ready for another cycle. In this embodiment, the heat harvesting structure 718 may include one or more heat pipes having their cold interfaces in thermal contact with the first surface 712 and their hot interfaces positioned to be in contact with the user, so that the heat pipes can transfer thermal energy from the user (e.g., user's inner ear) to the first surface 712 of the thermoelectric generator assembly 710.

Alternatively, the heat harvesting structure 718 may be any suitable structures that facilitate heat transfer from the in-ear end 704 to the thermoelectric generator assembly 710.

The thermoelectric generating parts 716 may be formed from a thermoelectric material as described above with the thermoelectric generating parts 116. The first surface 712 and the second surface 714 may be external surfaces of thermal conductive materials attached to the thermoelectric generation parts 716. The material of the first surface 712 and the second surface 714 may have higher thermal conductivity than the thermoelectric generating parts 716.

The present disclosure includes any wearable devices that include a thermoelectric generator assembly positioned to directly or indirectly contact a portion of the user's body. Suitable wearable devices may include eye glasses, hearing aids, smart watches, medical devices, ankle bracelets or other tracking devices, or any electronic devices configured to be worn by a human being, or an animal, such as a pet.

Figure 8A:
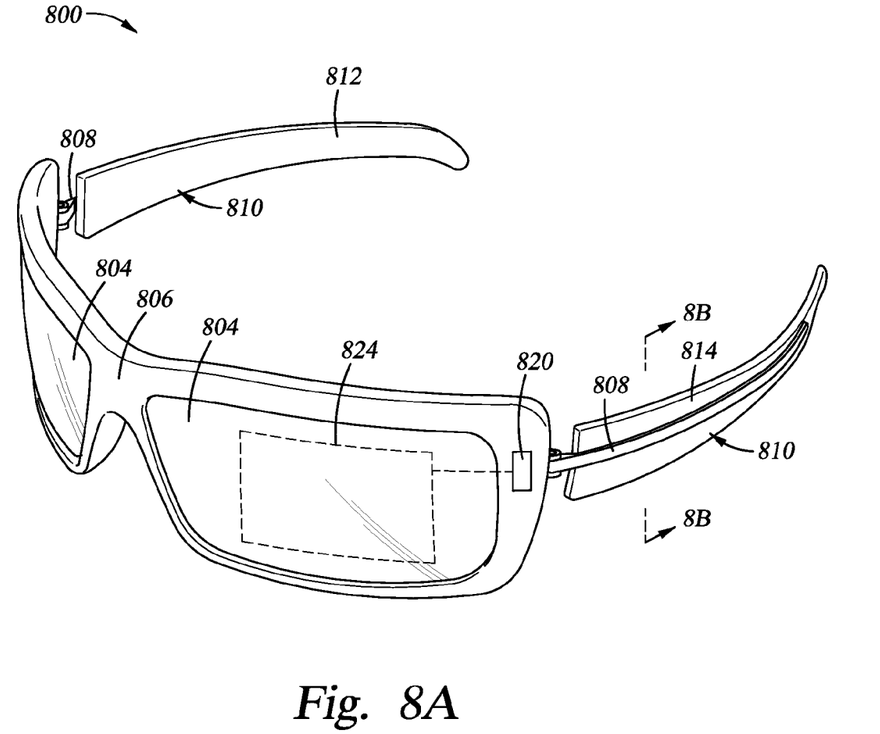
FIG. 8A is a schematic perspective view of eye glasses that is powered by electricity according to one embodiment of the present disclosure.
Figure 8B:
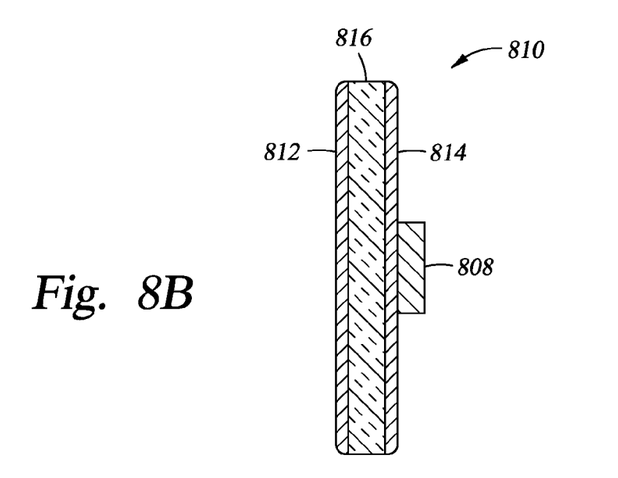
FIG. 8B is a schematic partial sectional view showing a thermoelectric generator assembly in the eye glasses of FIG. 8A according to one embodiment of the present disclosure.

FIGS. 8A-8B schematically illustrate a pair of eye glasses 800 including an electronic device that is powered by a thermoelectric generator assembly. FIG. 8A is a schematic view of the eye glasses 800. The eye glasses 800 may include a frame 806, a pair of lenses 804 installed in the frame 806. Two temple arms 808 that extend from a portion of the frame 806. The eye glasses 800 further include an electronic device 820 for perform various intended functions, such as receiving and displaying visual content to a user via a display device 824. The eye glasses 800 further include at least one thermoelectric generator assembly 810. The thermoelectric generator assembly 810 provides electricity to the electric device 820.

The electronic device 820 may include portions of a cell phone (e.g. a smart phone), automatic liquid crystal display sun shades, a camera, a communications device, or other suitable useful devices. The electronic device 820 may also include at least some of components found in the wireless audio device 120, which is discussed above. The electronic device 820 may further include display driving components (e.g., drivers for LCDs, OLEDs, etc.) that are configured to drive the display device 824. The electronic device 820 may be coupled to, positioned on or positioned within the frame 806 or in any other suitable location.

The thermoelectric generator assembly 810 may be positioned to be in contact with a user when the user is wearing the eye glasses 800. In one embodiment, the eye glasses 800 may include two thermoelectric generator assemblies 810 attached to the temple arms 808, so that the thermoelectric generator assemblies 810, which are in contact with the user when the user is wearing the eye glasses 800, can generate electricity that will power the electronic device 820. The thermoelectric generator assembly 810 may be alternately, or additionally, disposed in other locations, such as on a bridge area between the lenses 804.

FIG. 8B is a schematic partial sectional view showing the thermoelectric generator assembly 810 that is electrically coupled to the electronic device 820. The thermoelectric generator assembly 810 may have a first surface 812 positioned to be in contact with a portion of the user's head, and a second surface 814 positioned to be exposed to the ambient environment. One or more thermoelectric generating parts 816 are disposed between the first surface 812 and the second surface 814 so that the thermoelectric generating parts 816 can be used to convert a temperature difference between the first surface 812 and the second surface 814 into electrical energy that is provided through a wire or conductive trace (not shown) to the electrical components in the electronic device 820 and/or other electrical components in the eye glasses 800. The thermoelectric generating parts 816 may be formed from a thermoelectric material, as described above with the thermoelectric generating parts 116. The first surface 812 and the second surface 814 may be the external surfaces of the thermal conductive materials that are thermally coupled to the thermoelectric generation parts 816. The material disposed at the first surface 812 and the second surface 814 may have a higher thermal conductivity than the thermoelectric generating parts 816.

In one embodiment, the eye glasses 800 may be an eye wear providing display function for a smart phone, a computer or other devices in a hands-free format. As shown in FIG. 8A, a display device 824 may be superimposed over the lens 804. The display device 824 may be in connection with the electronic device 820 to provide display functions. For example, the electronic device 820 may include a wireless communication device that is connectable to a remote device, such as a cell phone, a computer, a video player, or other suitable devices. The electronic device 820 may be connected to the display device 824 so as to transmit visual/graphical information to the user that duplicates the screen display of the remote device and/or is based on visual/graphical information delivered from the remote device. In some embodiments, the eye glasses 800 include a frame 806 that has at least one lens 804 and an electronic device 820, wherein the electronic device 820 is configured to provide audio information and/or visual information to a user via the display device 824 and/or separate headphones (not shown). In this configuration, the thermoelectric generator assembly 810 may be configured to provide electrical power to the electric device 820, display device 824 and/or headphones (not shown) to provide the desired audio and/or visual information to the user.

Alternatively, the eye glasses 800 may be electrically operated eye ware. For example, the eye glasses 800 may be 3D glasses, or 3D shutter glasses, that are used to render three dimensional images from a video or other display signal generating device. In one example, the displaying signal generating device may include components used to deliver visual content to a plasma display, a liquid crystal display, a CRT, a projector, or other video displaying devices, or even these devices themselves. In another embodiment, the eye glasses 800 may be automatic LCD sun shades that adjust the amount of light transmission through the lenses 804 using information received from a light sensor found in the electronic device 820 or other light sensing remote device.

In some configurations, the eye glasses 800 may also receive electrical energy from other thermoelectric generating parts that are in contact with the user, such as one or more of the thermoelectric generator assemblies 110, 210, 610 and 710 illustrated in FIGS. 1-7. In some embodiments, the eye glasses 800 may also receive electrical energy from a secondary power unit 142. In some configurations, the eye glasses 800 may not include the thermoelectric generator assembly 810, and receive all or most of its power from one or more of the thermoelectric generator assemblies 110, 210, 610 and 710 and/or a secondary power unit 142.

The disclosure has been described above with reference to specific embodiments. Various embodiments may be used in alone or in combination. Persons skilled in the art, however, will understand that various modifications and changes may be made thereto without departing from the broader spirit and scope of the disclosure as set forth in the appended claims. The foregoing description and drawings are, accordingly, to be regarded in an illustrative rather than a restrictive sense.

The invention claimed is:

1. A device for providing information to a user, comprising:
   a wireless audio device capable of generating an acoustic output from signals received through a wireless communication link;
   a headband or a helmet connected to the wireless audio device; and
   a thermoelectric generator assembly configured to provide electrical power to the wireless audio device when a portion of the thermoelectric generator assembly is disposed over or in contact with a portion of the user, wherein the thermoelectric generator assembly is disposed on the headband or the helmet, the thermoelectric generator assembly has a first surface positioned to contact the user's head and a second surface positioned to face an ambient environment.

2. The device of claim 1, wherein the wireless audio device comprises:
   a transceiver capable of establishing the wireless communication link; and
   one or more speakers.

3. The device of claim 1, wherein the thermoelectric generator assembly comprises:
   a thermoelectric generating part having a first side that is in thermal contact with the first surface and a second side that is in thermal contact with the second surface, wherein the thermoelectric generating part generates electrical energy when a temperature difference is created between the first side and the second side.

4. The device of claim 3, wherein the thermoelectric generator assembly further comprises:
   a first thermal conductor attached to the first side of the thermoelectric generating part, wherein the first thermal conductor forms the first surface; and
   a second thermal conductor attached to the second side of the thermoelectric generating part, wherein the second thermal conductor forms the second surface.

5. The device of claim 1, wherein
   the wireless audio device further comprises a first ear cover and a second ear cover, and the headband is disposed between the first ear cover and the second ear cover.

6. The device of claim 1, wherein the thermoelectric generator assembly is disposed in a head cover of the helmet.

7. The device of claim 1, wherein the thermoelectric generator assembly further comprises a heat harvesting structure, wherein the heat harvesting structure comprises one or more heat pipes.

8. The device of claim 1, further comprising:
   a storage unit coupled to the thermoelectric generator assembly, wherein the storage unit stores electrical energy generated by the thermoelectric generator assembly.

9. The device of claim 8, wherein the storage unit comprises one or more rechargeable batteries.

10. The device of claim 1, further comprising:
    a secondary power source coupled to the wireless audio device, wherein the secondary power source comprises a solar cell.

11. The device of claim 1, further comprising a secondary power source that comprises one or more batteries, and the one or more batteries are configured to receive power generated by the thermoelectric generator assembly.

12. The device of claim 1, further comprising a heat harvesting structure attached to the first surface of the thermoelectric generator assembly, wherein the heat harvesting structure comprises an array of conductive teeth extending from the first surface.

13. The device of claim 1, further comprising:
    a second headband; and
    a second thermoelectric generator assembly attached to the second headband, wherein the second thermoelectric generator assembly has a first surface positioned to contact the user's head and a second surface positioned to face the ambient environment.

14. The device of claim 1, wherein the thermoelectric generator assembly generates electric power between about 60 milliwatts to about 100 milliwatts.

15. A system for providing information to a user, comprising:
    a wireless headphone comprising:
       a wireless audio device capable of generating an acoustic output from signals received through a wireless communication link;
       a headband or a helmet connected to the wireless audio device; and
       a thermoelectric generator assembly configured to provide electrical power to the wireless audio device when a portion of the thermoelectric generator assembly is disposed over or in contact with a portion of a user, wherein the thermoelectric generator assembly is disposed on the headband or the helmet, and the thermoelectric generator assembly has a first surface positioned to contact the user's head and a second surface positioned to face an ambient environment; and
    an audio source comprising a transceiver capable of establishing a wireless communication link with the wireless headphone.

16. The system of claim 15, wherein the thermoelectric generator assembly comprises:
    a thermoelectric generating part having a first side and a second side, wherein the thermoelectric generating part generates electrical energy when a temperature difference is created between the first side and the second side.

17. The system of claim 15, wherein the audio source is one of a video game console, a personal computer, a tablet computer, a laptop computer, a digital music player, a cell phone, an stereo system, a television, a video player, a radio, or other similar device.

18. A method of providing information to a user, comprising:
    generating electricity using a thermoelectric generator assembly by contacting a first surface of the thermoelectric generator assembly to a body part of a user while exposing a second surface of the thermal electric generator assembly to an ambient environment to obtain a temperature difference between the first surface and the second surface, wherein thermoelectric generator assembly is disposed on a headband or a helmet connected to a wireless audio device, the thermoelectric generator assembly has a first surface positioned to contact the user's head and a second surface positioned to face the ambient environment; and
    providing the electricity generated by the thermoelectric generator assembly to the wireless audio device.

19. The method of claim 18, further comprising:
    connecting a secondary power source to the wireless audio device.

20. The method of claim 18, further comprising:
generating an acoustic output from a speaker disposed within the wireless audio device, wherein at least a part of the power required to generate the acoustic output is generated by the thermoelectric generator assembly.

21. A device for providing information to a user, comprising:
a wireless audio device capable of generating an acoustic output from signals received through a wireless communication link;
an ear cover connected to the wireless audio device; and
a thermoelectric generator assembly configured to provide electrical power to the wireless audio device when a portion of the thermoelectric generator assembly is disposed over or in contact with a portion of the user, wherein the thermoelectric generator assembly is disposed on the ear cover, and the thermoelectric generator assembly has a first surface positioned to contact the user's head and a second surface positioned to face an ambient environment.

* * * * *